United States Patent
Cheng

(10) Patent No.: US 10,797,648 B2
(45) Date of Patent: Oct. 6, 2020

(54) MIXER MODULE

(71) Applicant: RichWave Technology Corp., Taipei (TW)

(72) Inventor: Ting-Yuan Cheng, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/579,870

(22) Filed: Sep. 24, 2019

(65) Prior Publication Data

US 2020/0186088 A1  Jun. 11, 2020

(30) Foreign Application Priority Data

Dec. 7, 2018 (TW) ............... 107144234 A

(51) Int. Cl.
| | |
|---|---|
| H04B 1/26 | (2006.01) |
| H03D 7/14 | (2006.01) |
| H03D 3/00 | (2006.01) |
| H03G 3/30 | (2006.01) |
| H03H 11/48 | (2006.01) |

(52) U.S. Cl.
CPC ........... *H03D 7/1491* (2013.01); *H03D 3/008* (2013.01); *H03D 7/1433* (2013.01); *H03D 7/1458* (2013.01); *H03G 3/30* (2013.01); *H03H 11/483* (2013.01); *H03D 2200/0047* (2013.01)

(58) Field of Classification Search
CPC .... H03D 7/1491; H03D 3/008; H03D 7/1433; H03D 7/1458; H03D 2200/004; H03G 3/30; H03H 11/483
USPC ...................................... 455/323
See application file for complete search history.

(56) References Cited

U.S. PATENT DOCUMENTS

| | | | |
|---|---|---|---|
| 3,605,032 A | 9/1971 | Kerwin | |
| 3,891,938 A | 6/1975 | Mikhael et al. | |
| 5,724,653 A * | 3/1998 | Baker | H03D 3/008 |
| | | | 455/296 |
| 5,961,215 A | 10/1999 | Lee et al. | |
| 6,148,047 A * | 11/2000 | Mohindra | H03D 3/008 |
| | | | 329/320 |
| 6,324,231 B1 * | 11/2001 | Huang | H03D 3/008 |
| | | | 375/243 |
| 6,498,929 B1 * | 12/2002 | Tsurumi | H03D 3/008 |
| | | | 327/307 |

(Continued)

FOREIGN PATENT DOCUMENTS

| | | |
|---|---|---|
| CN | 107508583 | 12/2017 |
| TW | 200518453 | 6/2005 |
| WO | 2009013697 | 1/2009 |

OTHER PUBLICATIONS

"Office Action of U.S. Appl. No. 16/579,877", dated Jul. 28, 2020, p. 1-p. 8.

*Primary Examiner* — Sonny Trinh
(74) *Attorney, Agent, or Firm* — JCIPRNET

(57) ABSTRACT

A mixer module includes a mixer, at least one DC offset circuit, a filter and a controller. The mixer mixes an input signal to generate a first signal. The at least one DC offset circuit generates a second signal based on the first signal. The filter filters out an AC portion of the second signal and generates a third signal according to a DC portion of the second signal. The controller controls the at least one DC offset circuit based on the third signal to reduce a DC portion of the first signal.

20 Claims, 11 Drawing Sheets

(56) References Cited

U.S. PATENT DOCUMENTS

| | | | |
|---|---|---|---|
| 6,549,054 B2 * | 4/2003 | Ono | H03F 3/087 |
| | | | 327/307 |
| 6,778,004 B1 | 8/2004 | Jackson | |
| 7,466,175 B2 | 12/2008 | Smith et al. | |
| 8,498,603 B2 * | 7/2013 | Aytur | H04B 1/30 |
| | | | 455/133 |
| 9,312,898 B2 | 4/2016 | Wagner | |
| 9,461,622 B2 | 10/2016 | Wang | |
| 9,484,871 B1 | 11/2016 | He et al. | |
| 10,484,213 B2 * | 11/2019 | Ray | G01D 21/00 |
| 2004/0157573 A1 * | 8/2004 | Lee | H03F 3/45995 |
| | | | 455/197.2 |
| 2005/0099221 A1 | 5/2005 | Kim et al. | |
| 2005/0258989 A1 * | 11/2005 | Li | H03M 1/1019 |
| | | | 341/120 |
| 2005/0282510 A1 | 12/2005 | Bang et al. | |
| 2006/0040633 A1 | 2/2006 | Watanabe et al. | |
| 2008/0246539 A1 | 10/2008 | Zadeh | |
| 2011/0275341 A1 | 11/2011 | Landmark et al. | |
| 2012/0002770 A1 | 1/2012 | Morita et al. | |

* cited by examiner

MIXER MODULE

CROSS-REFERENCE TO RELATED APPLICATION

This application claims the priority benefit of Taiwan application serial no. 107144234, filed on Dec. 7, 2018. The entirety of the above-mentioned patent application is hereby incorporated by reference herein and made a part of this specification.

BACKGROUND

Field of the Disclosure

The disclosure relates to a signal mixing technique and more particularly, to a mixer module.

Description of Related Art

In a communication system, a signal normally needs to be up-converted or down-converted for signal propagation and processing. This frequency conversion step is conventionally referred to as mixing and is an important process for receiving and transmitting signal chains. In addition, along with continuous development of wireless communication standards, advanced communication systems (for example, a 5G communication system) at present adopts a full-duplex technique, where receivers and transmitters are capable of simultaneously receiving and transmitting signals in the same frequency band for enhancing transmission capability of wireless networks.

However, in a condition that a receiver and a transmitter are both enabled, a direct current (DC) offset may occur when signals (e.g., signals to be mixed and signals used for the mixing) received by a mixer inside the receiver have portions at similar frequencies, such that the signals output through the mixer have DC portions, preventing signals from being effectively received, leading to performance degradation of the communication system.

SUMMARY

A mixer module of the disclosure includes a mixer, at least one DC offset circuit, a filter and a controller. The mixer mixes an input signal to generate a first signal. The at least one DC offset circuit generates a second signal based on the first signal. The filter filters out an AC portion of the second signal and generates a third signal according to a DC portion of the second signal. The controller controls the at least one DC offset circuit based on the third signal to reduce a DC portion of the first signal.

In order to make the aforementioned and other features and advantages of the disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
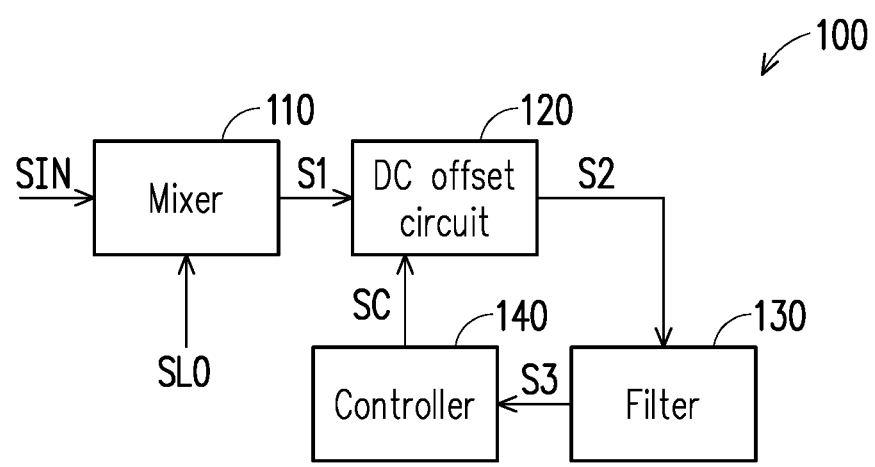
FIG. 1 is a block diagram illustrating a mixer module according to an embodiment of the disclosure.

FIG. 1 is a block diagram illustrating a mixer module according to an embodiment of the disclosure. Referring to FIG. 1, a mixer module 100 includes a mixer 110, at least one DC offset circuit 120, a filter 130 and a controller 140. The mixer 110 is coupled to the DC offset circuit 120, and the DC offset circuit 120 is coupled to the filter 130 and the controller 140.

In an embodiment of the disclosure, the mixer 110 mixes an input signal SIN to generate a signal S1. Specifically, in some embodiments, the mixer 110 receives a local oscillation signal SLO to mix the input signal SIN. The DC offset circuit 120 generates a signal S2 based on the signal S1. The filter 130 filters out an alternating current (AC) portion of the signal S2 and generates a signal S3 according to a DC portion of the signal S2. The controller 140 controls the DC offset circuit 120 based on the signal S3 to reduce a DC portion of the signal S1. In detail, the controller 140 generates a control signal SC based on the signal S3 to control the DC offset circuit 120 to reduce the DC portion of the signal S1 for generating the signal S2. The mixer module 100 of the present embodiment adjusts the DC portion of the mixed input signal (i.e., the signal S1) through the DC offset circuit 120, such that the DC portion of the adjusted mixed input signal (i.e., the signal S2) is reduced. Thus, the mixer module 100 is capable of outputting an accurate signal, so as to enhance the performance of the overall system.

Figure 2:
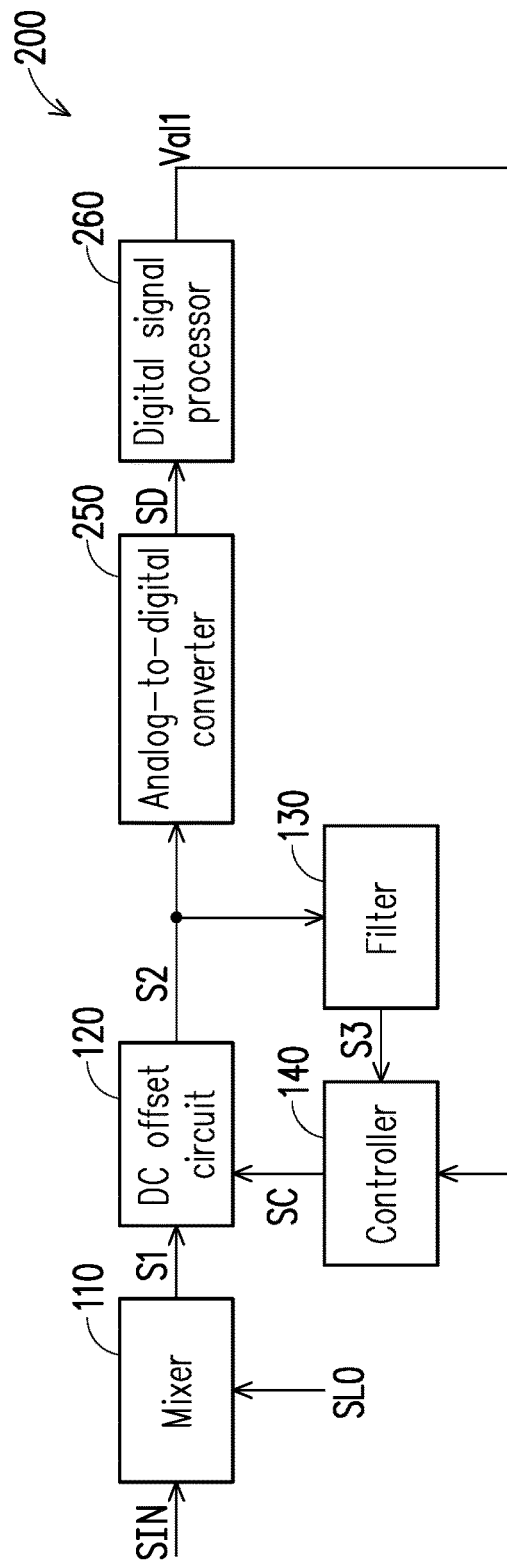
FIG. 2 is a block diagram illustrating a mixer module according to another embodiment of the disclosure.

FIG. 2 is a block diagram illustrating a mixer module according to another embodiment of the disclosure. Referring to FIG. 2, a mixer module 200 illustrated in FIG. 2 is different from the mixer module 100 illustrated in FIG. 1 in that the mixer module 200 may optionally include an analog-to-digital converter (ADC) 250 and a digital signal processor 260. The ADC 250 is coupled between the DC offset circuit 120 and the digital signal processor 260. The ADC 250 receives the signal S2 and converts the signal S2 into a digital output signal SD. The digital signal processor 260 receives the digital output signal SD, generates a correction value Val1 based on the digital output signal SD and outputs the correction value Val1 to the controller 140. In the present embodiment, the controller 140 generates the control signal SC based on the signal S3 or the correction value Val1 to control the DC offset circuit 120.

Figure 3:
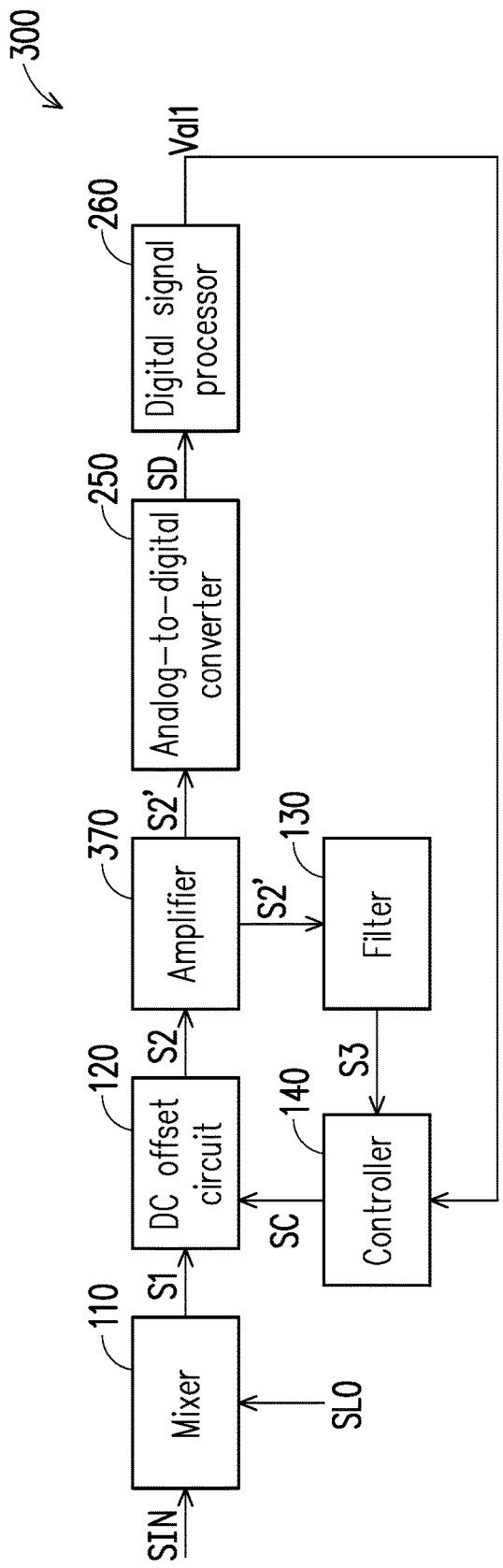
FIG. 3 is a block diagram illustrating a mixer module according to another embodiment of the disclosure.

FIG. 3 is a block diagram illustrating a mixer module according to another embodiment of the disclosure. Referring to FIG. 3, a mixer module 300 illustrated in FIG. 3 is different from the mixer module 100 illustrated in FIG. 1 in that the mixer module 300 may optionally include at least one amplifier 370. The amplifier 370 is coupled between the DC offset circuit 120 and the filter 130. The amplifier 370 amplifies the signal S2 and outputs an amplified signal S2' to the filter 130. The amplifier 370 is, for example, an intermediate frequency (IF) amplifier, however, the type of the amplifier 370 is not limited in the disclosure. In some embodiments, the mixer module 300 includes a plurality of serially connected amplifiers to use the plurality of amplifiers having less gain values to achieve an amplification effect same as that by using one amplifier. For example, an amplifier having a gain value of 2 and another amplifier having a gain value of 5 are connected in series to achieve an amplification effect same as that by using one amplifier having a gain value of 10.

In some embodiments, the mixer module 300 may also optionally include the ADC 250 and the digital signal processor 260 of the mixer module 200 illustrated in FIG. 2. In the present embodiment, the amplifier 370 is further coupled between the DC offset circuit 120 and the ADC 250. The ADC 250 receives the amplified signal S2' and converts the amplified signal S2' into the digital output signal SD. Thereafter, the digital signal processor 260 receives the digital output signal SD, generates the correction value Val1 based on the digital output signal SD and outputs the correction value Val1 to the controller 140.

It is to be specifically mentioned herein that the mixer module may be applied in a single-ended circuit or a double-ended circuit. When being applied in a single-ended circuit, the mixer is, for example, a single balanced mixer, and when being applied in a double-ended circuit, the mixer is, for example, a double balanced mixer. The type of the mixer is not limited in the disclosure. Additionally, in some embodiments, the filter may be, for example, a low pass filter (LPF), while the LPF may be, for example, a capacitance multiplier filter, and the type of the filter is not limited in the disclosure. In some embodiments, the digital signal processor may be applied in, for example, a digital signal processing (DSP) baseband circuit, which is not limited in the disclosure.

Figure 4:
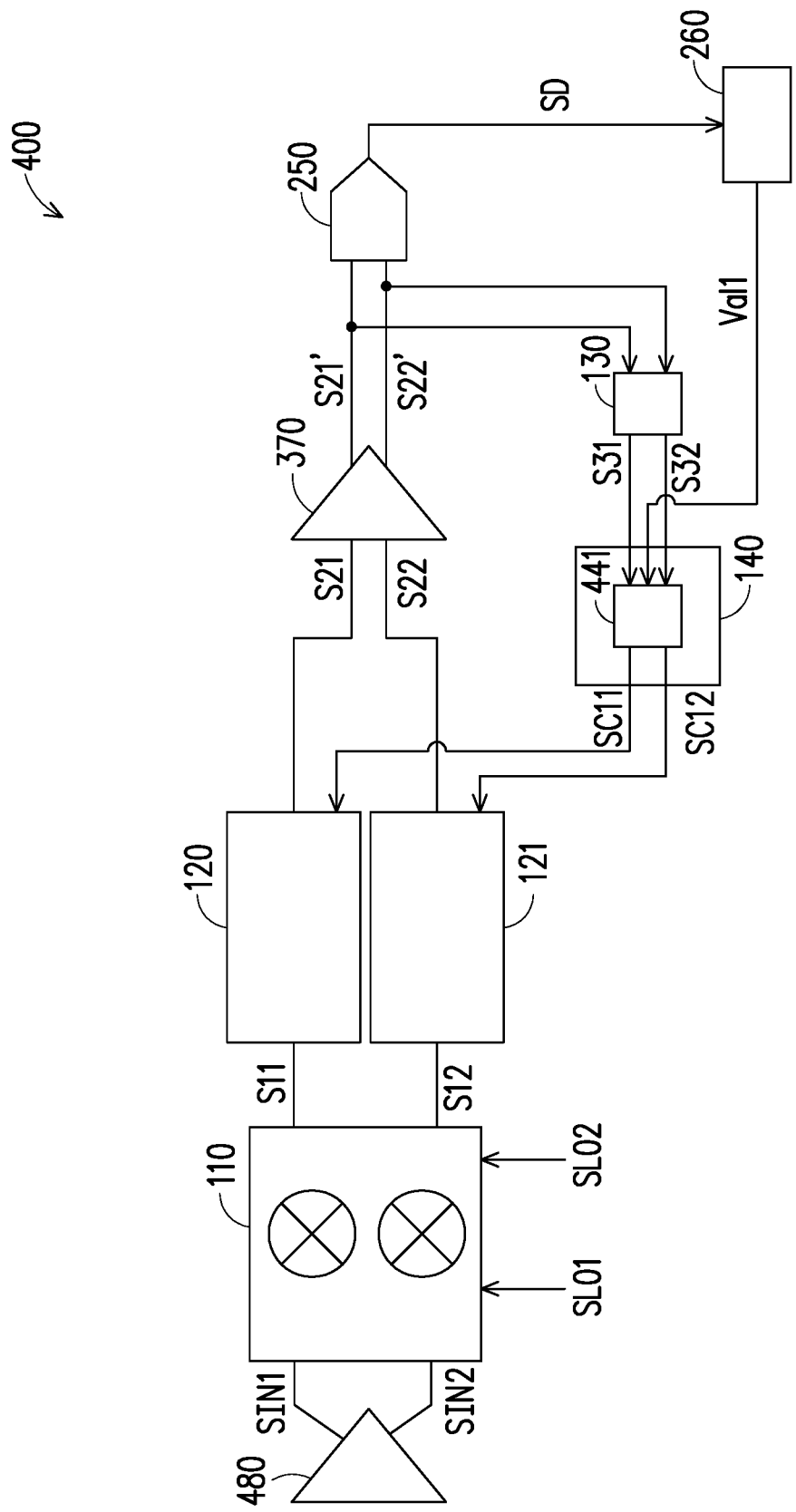
FIG. 4 is a detailed block diagram illustrating a mixer module according to an embodiment of the disclosure.

FIG. 4 is a detailed block diagram illustrating a mixer module according to an embodiment of the disclosure. FIG. 4 illustrates an example that the mixer module is applied in a double-ended circuit. Referring to FIG. 4, a mixer module 400 illustrated in FIG. 4 is different from the mixer module 300 illustrated in FIG. 3 in that the mixer module 400 further includes a DC offset circuit 121 and a low noise amplifier (LNA) 480.

In the present embodiment, the input signal SIN includes a pair of differential signals, which are an input signal SIN1 and an input signal SIN2. The local oscillation signal SLO includes a pair of differential signals, which are a local oscillation signal SLO1 and a local oscillation signal SLO2. The signal S1 includes a pair of differential signals, which are a signal S11 and a signal S12. The signal S2 includes a pair of differential signals, which are a signal S21 and a signal S22. The amplified signal S2' includes a pair of differential signals, which are an amplified signal S21' and an amplified signal S22'. The signal S3 includes a pair of differential signals, which are a signal S31 and a signal S32. The control signal SC includes a pair of differential signals, which are a control signal SC11 and a control signal SC12. However, in some embodiments, the input signal SIN, the local oscillation signal SLO, the signals S1 to S3, and the control signal SC may be a single-ended signal, and the disclosure is not limited thereto.

Specifically, the LNA 480 is coupled to the mixer 110 and is configured to generate the input signals SIN1 and SIN2. The mixer 110 receives the local oscillation signals SLO1 and SLO2 to mix the input signals SIN1 and SIN2 to generate the signals S11 and S12. The DC offset circuits 120 and 121 respectively generate the signals S21 and S22 based on the signals S11 and S12. The amplifier 370 amplifies the signals S21 and S22 and outputs amplified signals S21' and S22' to the filter 130 and the ADC 250. The filter 130 filters out AC portions of the amplified signals S21' and S22' to generate the signals S31 and S32 according to DC portions of the amplified signals S21' and S22'. The ADC 250 converts the amplified signals S21' and S22' into the digital output signal SD. The digital signal processor 260 receives the digital output signal SD to generate the correction value Val1 based on the digital output signal SD to output to the controller 140. The controller 140 respectively controls the DC offset circuits 120 and 121 based on the signals S31 to S32 or the correction value Val1 to reduce the DC portions of the signals S11 and S12 to generate the signals S21 and S22.

In the present embodiment, the controller 140 in the mixer module 400 includes a control circuit 441 configured to perform coarse adjustment operations to the DC offset circuits 120 and 121 for reducing the DC portions of the signals S11 and S12. Specifically, the control circuit 441 generates the control signals SC11 and SC12 based on the signals S31 to S32 or the correction value Val1, and then, the DC offset circuits 120 and 121 reduce the DC portions of the signals S11 and S12 based on the control signals SC11 and SC12.

Figure 5A:
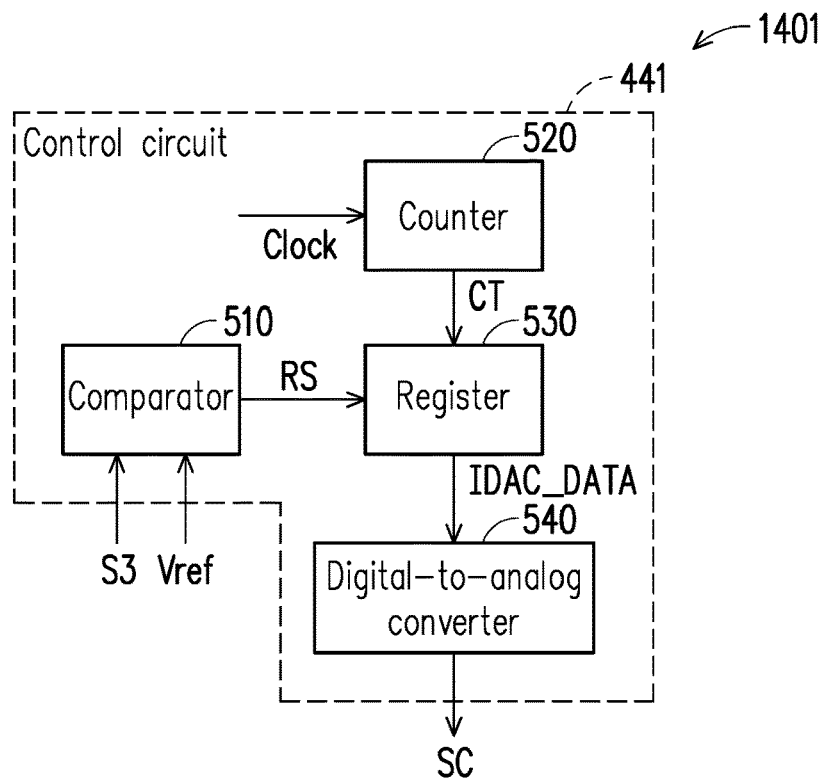
FIG. 5A is a detailed block diagram illustrating a controller according to an embodiment of the disclosure.

Herein, details related to the controller 140 performing the coarse adjustment operations will be described with reference to FIG. 5A to FIG. 5D. FIG. 5A is a detailed block diagram illustrating a controller according to an embodiment of the disclosure. Particularly, when the mixer module is applied in a single-ended circuit, it is applicable to a controller 1401 illustrated in FIG. 5A. Referring to FIG. 5A, the control circuit 441 in the controller 1401 includes a comparator 510, a counter 520, a register 530 and a digital-to-analog converter (DAC) 540. The register 530 is coupled to the comparator 510, the counter 520 and the DAC 540.

In an embodiment of the disclosure, the comparator 510 compares the signal S3 outputted by the filter 130 with a predetermined voltage Vref to generate a comparison result RS. The counter 520 receives a clock signal Clock to count a value CT. The register 530 generates a correction value IDAC_DATA according to the comparison result RS and the value CT. The DAC 540 converts the correction value IDAC_DATA into the control signal SC. In the present embodiment, the control circuit 441 is, for example, a hardware element capable of executing binary search to generate the control signal SC, and the register 530 is, for example, a successive approximation register, but the disclosure is not limited thereto. In the present embodiment, the predetermined voltage Vref is, for example, a common mode voltage, which is not particularly limited in the disclosure. In some embodiments, the comparator 510 of the control circuit 441 may directly compare the signal S3 outputted by the filter 130 with the predetermined voltage Vref to generate the control signal SC.

Figure 5B:
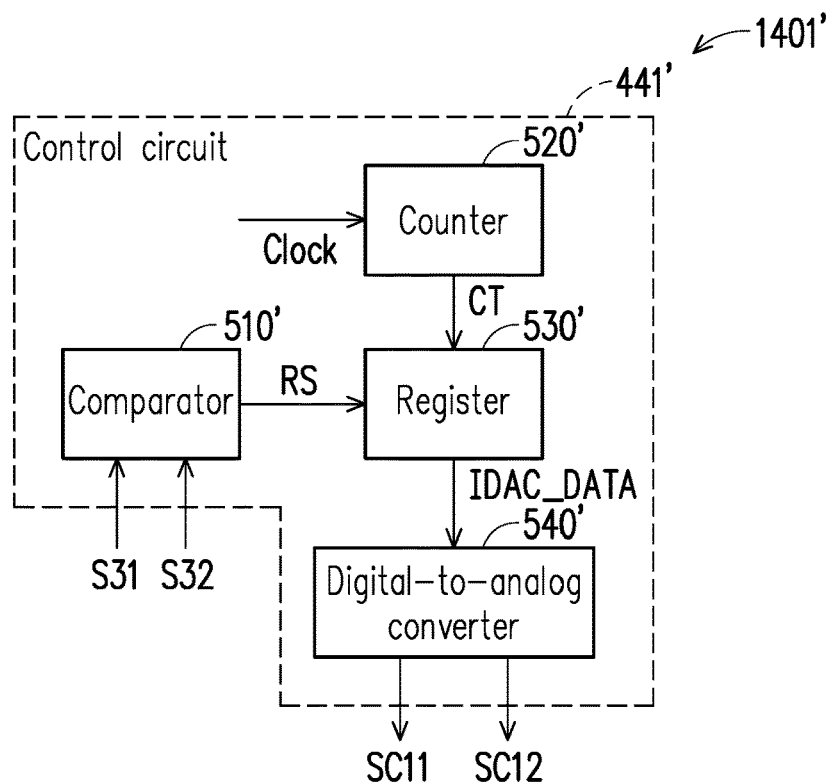
FIG. 5B is a detailed block diagram illustrating a controller according to another embodiment of the disclosure.

FIG. 5B is a detailed block diagram illustrating a controller according to another embodiment of the disclosure. Particularly, when the mixer module is applied in the double-ended circuit, it is applicable to a controller 1401' illustrated in FIG. 5B. Referring to FIG. 5B, the controller 1401' illustrated in FIG. 5B is different from the controller 1401 illustrated in FIG. 5A in that in the controller 1401', a comparator 510' of a control circuit 441' compares the signals S31 and S32 to generate the comparison result RS. In other words, the signal S3 received by the comparator 510' includes a pair of differential signals. A counter 520' receives the clock signal Clock to count the value CT. A register 530' generates the correction value IDAC_DATA according to the comparison result RS and the value CT. A DAC 540' converts the correction value IDAC_DATA into the control signals SC11 and SC12. In some embodiments, the comparator 510' of the control circuit 441' may directly compare the signals S31 and S32 to generate the control signals SC11 and SC12.

In some embodiments, the DACs 540 and 540' are, for example, current-type DACs, and the control signals SC, SC11 and SC12 may include current control signals. In other embodiments, the DACs 540 and 540' may also be voltage-type DACs, and the control signals SC, SC11 and SC12 may include voltage control signals, but the type of the DACs are not limited in the disclosure.

Figure 5C:
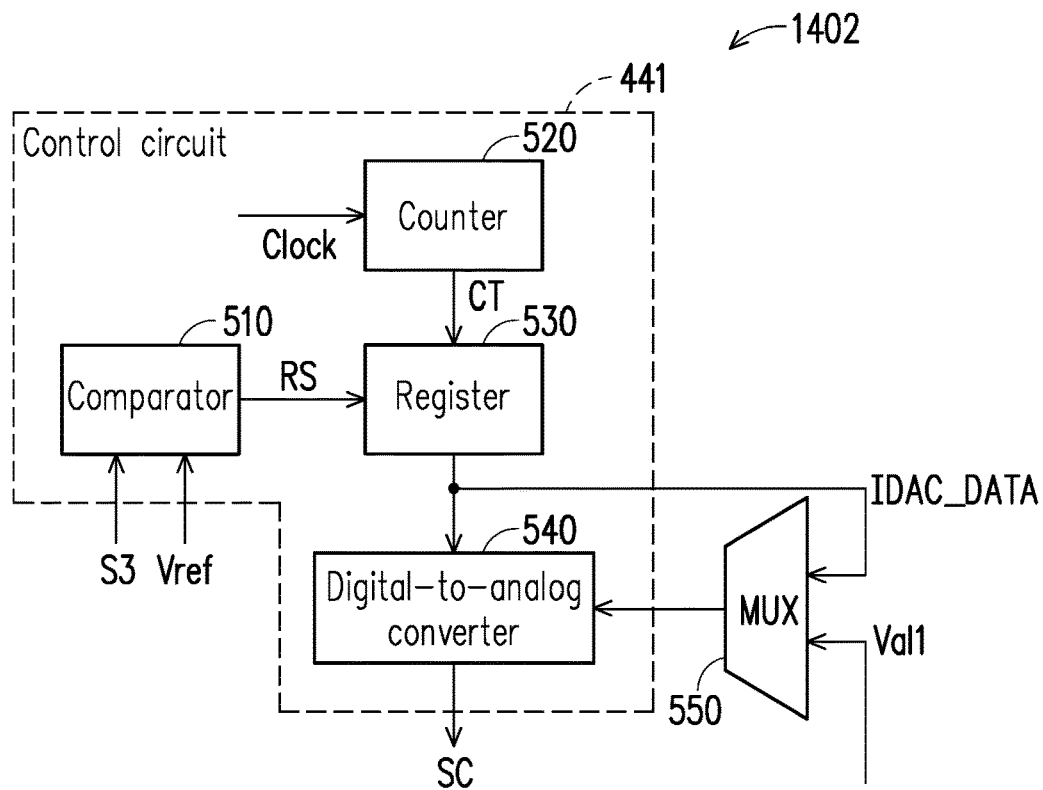
FIG. 5C is a detailed block diagram illustrating a controller according to another embodiment of the disclosure.

FIG. 5C is a detailed block diagram illustrating a controller according to another embodiment of the disclosure. Particularly, when the mixer module is applied to a single-ended circuit and includes the ADC 250 and the digital signal processor 260, it is applicable to a controller 1402 illustrated in FIG. 5C. Referring to FIG. 5C, the controller 1402 illustrated in FIG. 5C is different from the controller 1401 illustrated in FIG. 5A is in that the controller 1402 illustrated in FIG. 5C further includes a multiplexer (MUX) 550. In an embodiment of the disclosure, the control circuit 441 may generate the correction value IDAC_DATA based on the signal S3. An output terminal of the MUX 550 is coupled to a digital input terminal of the control circuit 441, a first terminal of the MUX 550 receives the correction value IDAC_DATA outputted by the control circuit 441, a second terminal of the MUX 550 receives the correction value Val1 outputted by the digital signal processor 260, and a control terminal (not shown) of the MUX 550 is controlled by the digital signal processor 260. The digital signal processor 260 controls the MUX 550 to select one of the correction values Val1 and IDAC_DATA as an output to the control circuit 441. The control circuit 441 generates the control signal SC based on the output of the MUX 550. Specifically, when the digital signal processor 260 determines that the correction value IDAC_DATA is over a predetermined range, the digital signal processor 260 controls the MUX 550 to select the correction value Val1 as the output. When the digital signal processor 260 determines that the correction value IDAC_DATA is not over the predetermined range, the digital signal processor 260 controls the MUX 550 to select the correction value IDAC_DATA as the output. In some embodiments, the digital signal processor 260 may also control the MUX 550 to directly select the correction value Val1 as the output, without determining whether the correction value IDAC_DATA is over the predetermined range.

Figure 5D:
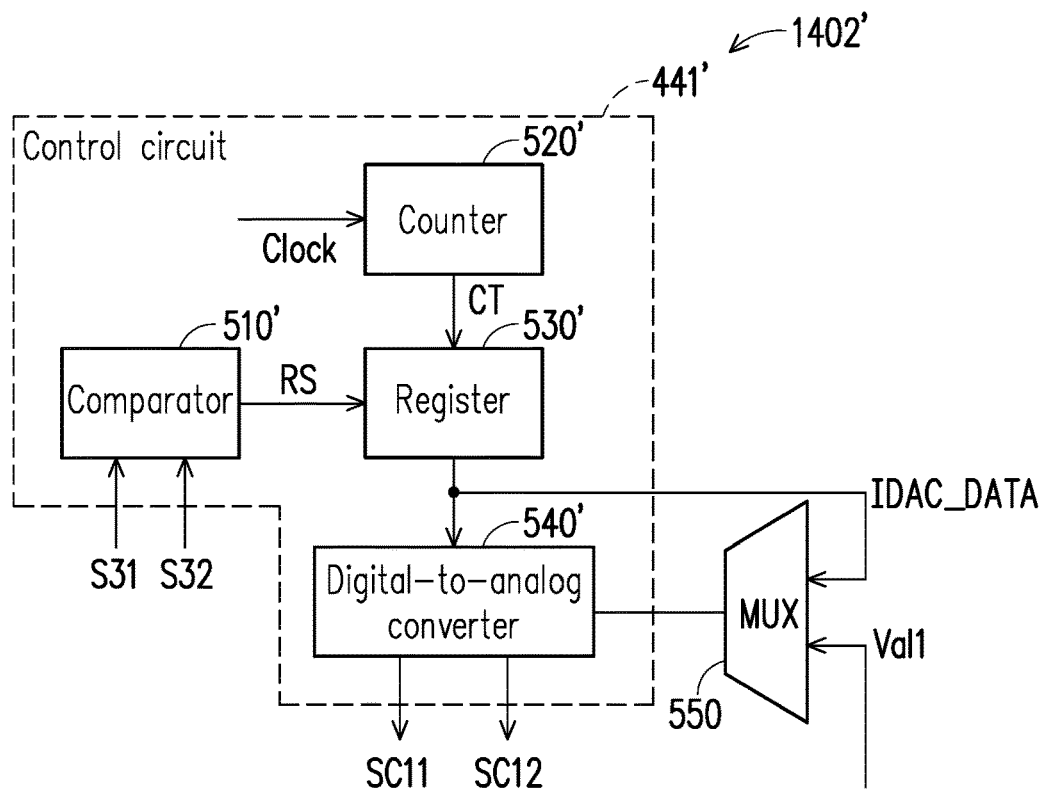
FIG. 5D is a detailed block diagram illustrating a controller according to another embodiment of the disclosure.

FIG. 5D is a detailed block diagram illustrating a controller according to another embodiment of the disclosure. Particularly, when the mixer module is applied in a double-ended circuit, and the mixer module includes the ADC 250 and the digital signal processor 260, it is applicable to a controller 1402' illustrated in FIG. 5D. Referring to FIG. 5D, the controller 1402' illustrated in FIG. 5D is different from the controller 1402 illustrated in FIG. 5C in the control circuit 441' in the controller 1402', and the circuit structure and function of the control circuit 441' are similar to those of the control circuit 441' illustrated in FIG. 5B and will not be described again.

Figure 6:
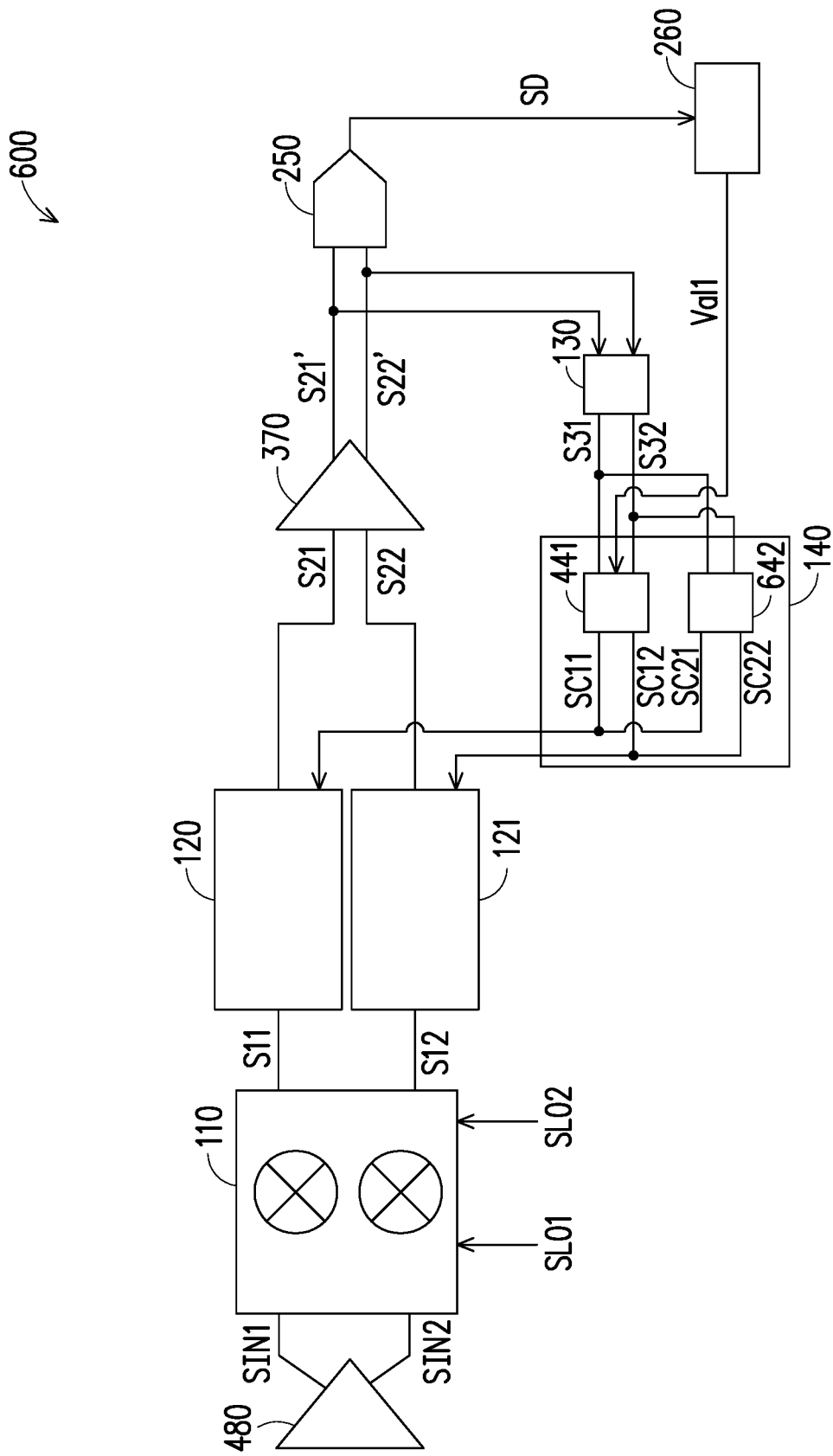
FIG. 6 is a detailed block diagram illustrating a mixer module according to another embodiment of the disclosure.

FIG. 6 is a detailed block diagram illustrating a mixer module according to another embodiment of the disclosure. A mixer module 600 illustrated in FIG. 6 is different from the mixer module 400 illustrated in FIG. 4 in that the controller 140 of the mixer module 600 illustrated in FIG. 6 further includes a control circuit 642 configured to perform fine adjustment operations to the DC offset circuits 120 and 121. In other words, the controller 140 illustrated in FIG. 6 may perform the coarse and the fine adjustment operations to the DC offset circuits 120 and 121 for reducing the DC portions of the signals S11 and S12. However, in some embodiments, the controller 140 in the mixer module 600 may also include only the control circuit 642 and perform only the fine adjustment operations to the DC offset circuits 120 and 121. Additionally, in some embodiments, when the mixer module is applied in a single-ended circuit, the controller 140 may also optionally include the control circuit 441 and/or the control circuit 642.

Referring to FIG. 6, in an embodiment of the disclosure, the control circuits 441 and 642 of the controller 140 respectively perform the coarse and the fine adjustment operations to the DC offset circuits 120 and 121. In an embodiment of the disclosure, the controller 140, further based on the signals S31 and S32, generates the control SC2, and the control signal SC2 includes a pair of differential signals, which are a control signal SC21 and a control signal SC22. The fine adjustment operation is performed by the control circuit 642 based on the signals S31 and S32 to generate the control signals SC21 and SC22, such that the DC offset circuits 120 and 121, further based on the control signals SC21 and SC22, reduce the DC portions of the signals S11 and S12. In the present embodiment, the DC offset circuit 120 is controlled by the combined control signals SC11 and SC21, and the DC offset circuit 121 is controlled by the combined control signals SC12 and SC22, which is not particularly limited in the disclosure. In some embodiments, the control circuit 642 includes a transconductance amplifier, which is not particularly limited in the disclosure.

Figure 7C:
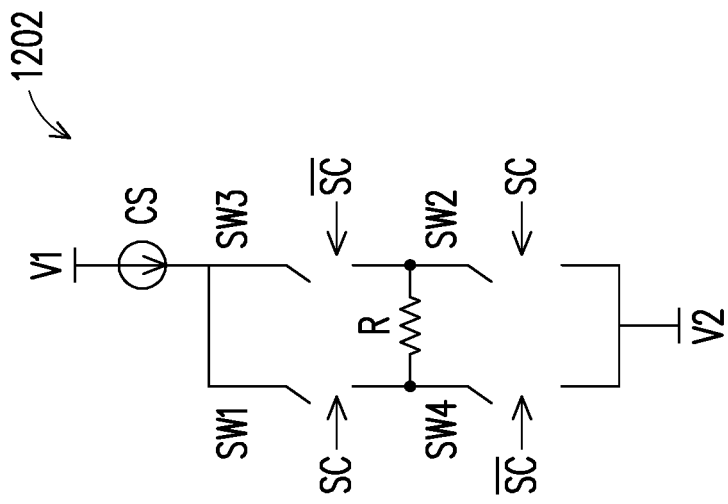
FIG. 7A to FIG. 7C are detailed circuit diagrams respectively illustrating the DC offset circuit in different embodiments.
Figure 7B:
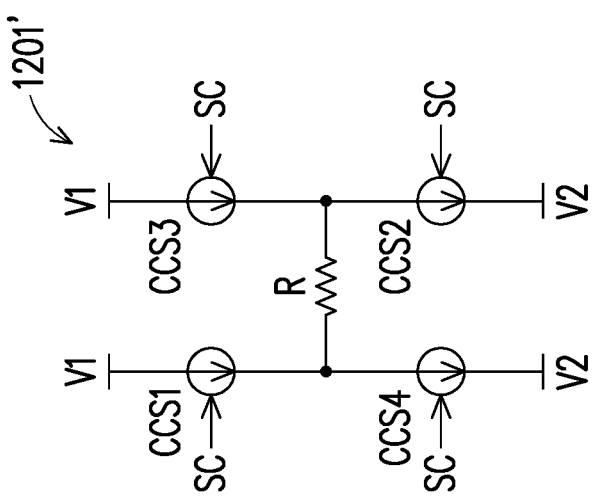
Figure 7A:
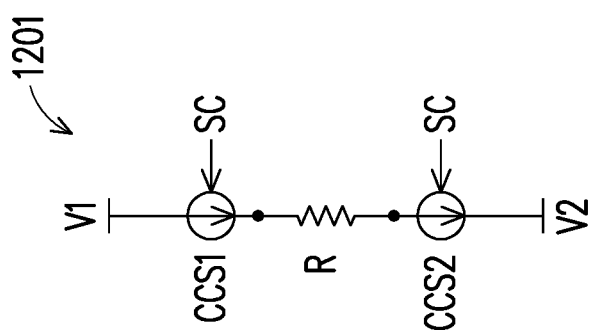

FIG. 7A to FIG. 7C are detailed circuit diagrams respectively illustrating the DC offset circuit 120 and/or the DC offset circuit 121 in different embodiments. It should be specially noted that FIG. 7A to FIG. 7C are examples of DC offset circuits, which are controlled by the control signals SC generated by the controller 140.

FIG. 7A is a circuit diagram illustrating a DC offset circuit according to an embodiment of the disclosure. Referring to FIG. 7A, in an embodiment of the disclosure, a DC offset circuit 1201 includes a controllable current source CCS1, a controllable current source CCS2 and a resistor R. A first terminal of the controllable current source CCS1 is coupled to a reference voltage terminal V1, a second terminal of the controllable current source CCS2 is coupled to a reference voltage terminal V2, a first terminal and a second terminal of the resistor R are respectively coupled to a second terminal of the controllable current source CCS1 and a first terminal of the controllable current source CCS2, and one of the first terminal and the second terminal of the resistor R is further coupled to an output terminal of the mixer 110 for receiving the signal S1 while the other one of the first terminal and the second terminal of the resistor R is further coupled to the filter 130 or the amplifier 370 for generating the signal S2. The controllable current sources CCS1 and CCS2 are controlled by the controller 140. In an embodiment of the disclosure, current values of the controllable current sources CCS1 and CCS2 are adjusted to generate a voltage drop between the first terminal and the second terminal of the resistor R, so as to compensate a DC offset in the signal S1 with the voltage drop to reduce the DC portion of the signal S1.

FIG. 7B is a circuit diagram illustrating a DC offset circuit according to another embodiment of the disclosure. ADC offset circuit 1201' illustrated in FIG. 7B is different from the DC offset circuit 1201 illustrated in FIG. 7A is in that the DC offset circuit 1201' further includes a controllable current source CCS3 and a controllable current source CCS4. A first terminal of the controllable current source CCS3 is coupled to the reference voltage terminal V1, and a second terminal of the controllable current source CCS4 is coupled to the reference voltage terminal V2. The first terminal and the second terminal of the resistor R are further respectively coupled to a first terminal of the controllable current source CCS4 and a second terminal of the controllable current source CCS3. The controllable current sources CCS3 and CCS4 are controlled by the controller 140. In an embodiment of the disclosure, current values of the controllable current sources CCS1 to CCS4 are adjusted to generate a voltage drop between the first terminal and the second terminal of the resistor R, so as to compensate the DC offset in the signal S1 with the voltage drop to reduce the DC portion of the signal S1.

FIG. 7C is a circuit diagram illustrating a DC offset circuit according to another embodiment of the disclosure. Referring to FIG. 7C, in an embodiment of the disclosure, a DC offset circuit 1202 includes a current source CS, a switch SW1, a switch SW2, a switch SW3, a switch SW4 and the resistor R. A first terminal of the current source CS is coupled to the reference voltage terminal V1, first terminals of the switches SW1 and SW3 are coupled to a second terminal of the current source CS, second terminals of the switches SW2 and SW4 are coupled to the reference voltage terminal V2, the first terminal of the resistor R is coupled to a second terminal of the switch SW1 and a first terminal of the switch SW4, the second terminal of the resistor R is coupled to a second terminal of the switch SW3 and a first terminal of the switch SW2, and one of the first terminal and the second terminal of the resistor R is further coupled to the output terminal of the mixer 110 for receiving the signal S1 while the other one of the first terminal and second terminal of resistor R is further coupled to the filter 130 or the amplifier 370 for generating the signal S2. The switches SW1 to SW4 are controlled by the controller 140. In an embodiment of the disclosure, conduction states of the switches SW1 to SW4 are adjusted to generate the voltage drop between the first terminal and the second terminal of the resistor R, so as to compensate the DC offset in the signal S1 with the voltage drop to reduce the DC portion of the signal S1. In an embodiment of the disclosure, an inverter may be coupled to the output terminal of the controller 140, so that the control signal received by the switches SW1 and SW2 and the control signal received by the switches SW3 and SW4 are inverted (for example, referring to the drawing, SC and $\overline{SC}$ are used to represent that the control signals are inverted to each other). In some embodiments, the DC offset circuit 1202 may include the current source CS and the resistor R. The first terminal and the second terminal of the current source CS are respectively coupled between the reference voltage terminals V1 and V2. The first terminal and the second terminal of the resistor R are respectively coupled between the second terminal of the current source CS and the reference voltage terminal V2, and one of the first terminal and the second terminal of the resistor R is further coupled to the output terminal of the mixer 110 for receiving the signal S1 while the other one of the first terminal and the second terminal of the resistor R is further coupled to the filter 130 or the amplifier 370 for generating the signal S2. The controller 140 is configured to adjust the voltage drop between the first terminal and the second terminal of the resistor R.

In some embodiments, in each of the DC offset circuits 1201 to 1202 described above, the reference voltage terminal V1 is, for example, configured to receive a supply voltage, and the reference voltage terminal V2 is, for example, configured to receive a ground voltage, which is not particularly limited in the disclosure.

Figure 8A:
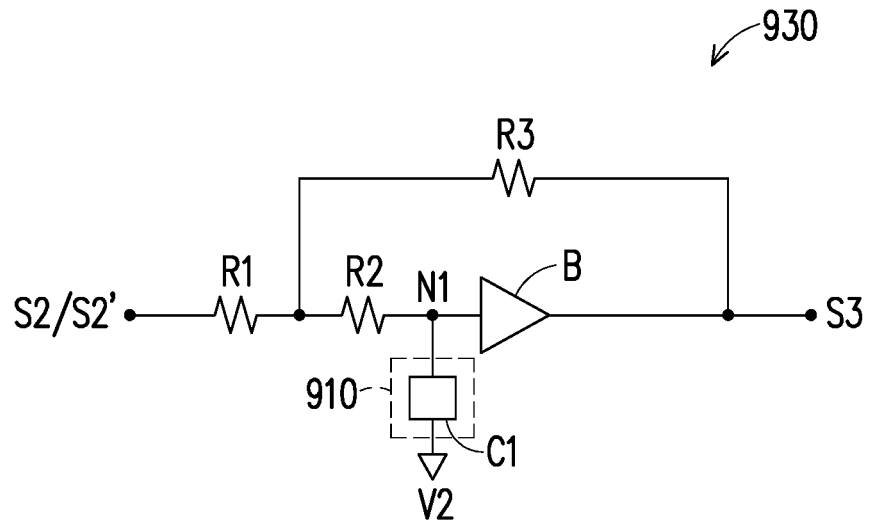
FIG. 8A to FIG. 8B are detailed circuit diagrams respectively illustrating the filter in different embodiments.
Figure 8B:
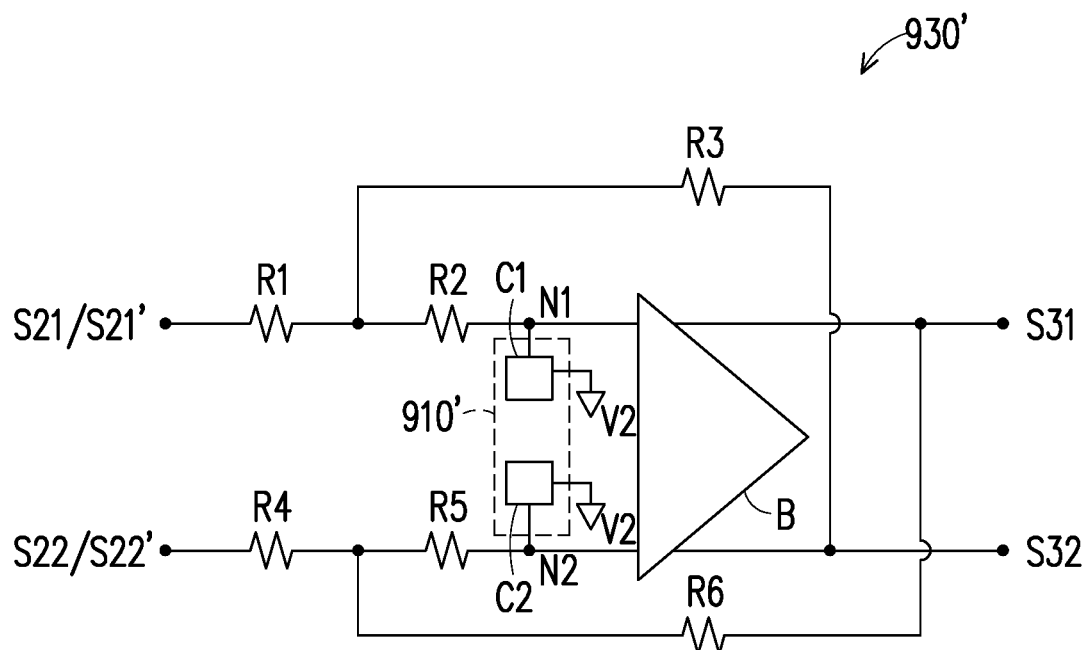

FIG. 8A to FIG. 8B are detailed circuit diagrams respectively illustrating the filter 130 in different embodiments. It should be specially noted that FIG. 8A to FIG. 8B illustrate the filter as a LPF and the LPF as a capacitance multiplier filter for example.

FIG. 8A is a circuit diagram illustrating a capacitance multiplier filter according to an embodiment of the disclosure. Particularly, when the mixer module is applied in a single-ended circuit, it is applicable to a capacitance multiplier filter 930 illustrated in FIG. 8A. Referring to FIG. 8A, in an embodiment of the disclosure, the capacitance multiplier filter 930 includes a capacitor module 910, a resistor R1, a resistor R2, a resistor R3 and a buffer B. The capacitor module 910 includes a capacitor circuit C1. The capacitor circuit C1 will be described with reference to FIG. 9A to FIG. 9C in detail. Herein, a circuit connection relationship of the capacitance multiplier filter 930 is described in advance. In the present embodiment, a first terminal of the resistor R1 is coupled to a first input terminal of the capacitance multiplier filter 930. A first terminal of the resistor R2 is coupled to a second terminal of the resistor R1. A first terminal of the resistor R3 is coupled to the second terminal of the resistor R1 and the first terminal of the resistor R2, and a second terminal of the resistor R3 is coupled to a first output terminal of the capacitance multiplier filter 930. A first receiving terminal of the buffer B is coupled to a second terminal of the resistor R2 and a first terminal N1 of the capacitor circuit C1, and a first output terminal of the buffer B is coupled to the second terminal of the resistor R3. A second terminal of the capacitor circuit C1 is coupled to the reference voltage terminal V2. The first input terminal of the capacitance multiplier filter 930 is configured to receive the signal S2 or the amplified signal S2', and the first output terminal of the capacitance multiplier filter 930 is configured to output the signal S3.

FIG. 8B is a circuit diagram illustrating a capacitance multiplier filter according to another embodiment of the disclosure. Particularly, when the mixer module is applied in a double-ended circuit, it is applicable to a capacitance multiplier filter 930' illustrated in FIG. 8B.

Referring to FIG. 8B, in an embodiment of the disclosure, the capacitance multiplier filter 930' illustrated in FIG. 8B is different from the capacitance multiplier filter 930 illustrated in FIG. 8A in that the buffer B further includes a second receiving terminal and a second output terminal, the capacitance multiplier filter 930' further including a second input terminal, a second output terminal, a resistor R4, a resistor R5 and a resistor R6, and a capacitor module 910' in the capacitance multiplier filter 930' further including another capacitor circuit C2, wherein the capacitor circuit C2 is the same as the capacitor circuit C1. The capacitor circuits C1 and C2 will be described with reference to FIG. 9A to FIG. 9C in detail. Herein, a circuit connection relationship of the capacitance multiplier filter 930' is described in advance. In the present embodiment, a first terminal of the resistor R4 is coupled to the second input terminal of the capacitance multiplier filter 930'. A first terminal of the resistor R5 is coupled to a second terminal of the resistor R4. A first terminal of the resistor R6 is coupled to the second terminal of the resistor R4 and the first terminal of the resistor R5, a second terminal of the resistor R6 is coupled to a first output terminal of the capacitance multiplier filter 930'. The second receiving terminal of the buffer B is coupled to a second terminal of the resistor R5 and a first terminal N2 of the capacitor circuit C2, the first output terminal of the buffer B is coupled to the first output terminal of the capacitance multiplier filter 930', and the second output terminal of the buffer B is coupled to the second terminal of the resistor R3. The second terminal of the resistor R3 is coupled to a second output terminal of the capacitance multiplier filter 930'. A second terminal of the capacitor circuit C2 is coupled to the reference voltage terminal V2. A first input terminal of the capacitance multiplier filter 930' is configured to receive the signal S21 or the amplified signal S21', and the second input terminal of the capacitance multiplier filter 930' is configured to receive the signal S22 or the amplified signal S22'. The first output terminal of the capacitance multiplier filter 930' is configured to output the signal S31, a second output terminal of the capacitance multiplier filter 930' is configured to output the signal S32.

In FIG. 8B, the capacitor circuits C1 and C2 of the capacitor module 910' have the same equivalent capacitance Ceff, and an equivalent circuit of the capacitor module 910' is the capacitor circuits C1 and C2 connected in series, such that an equivalent capacitance Cm of the capacitor module 910' is approximate to (½)×Ceff.

Figure 9A:
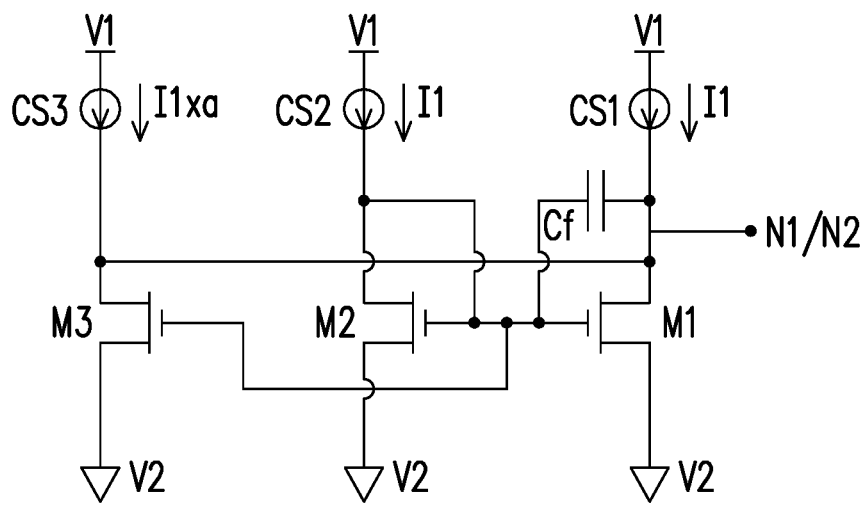
FIG. 9A to FIG. 9C are detailed circuit diagrams illustrating the capacitor circuits in different embodiments.
Figure 9B:
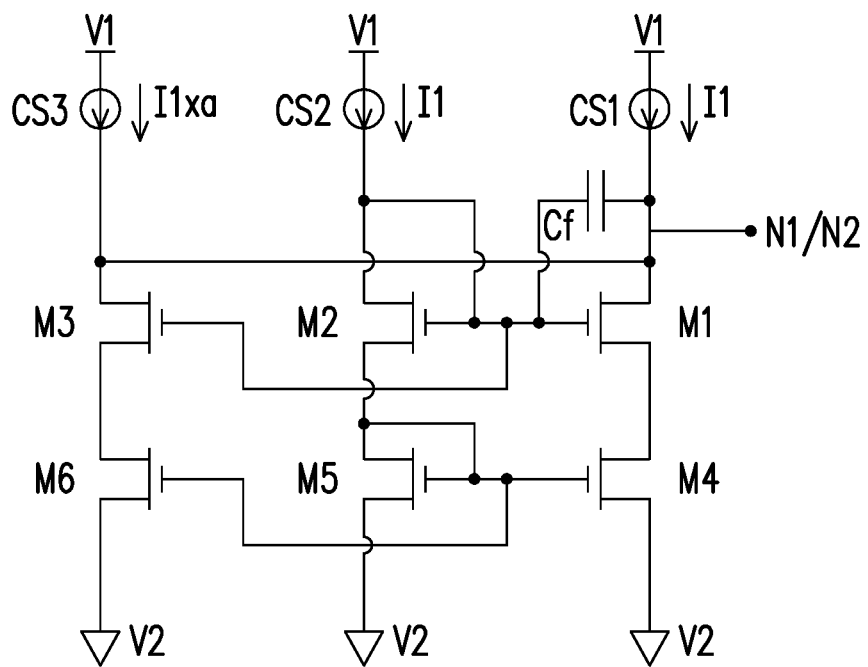
Figure 9C:
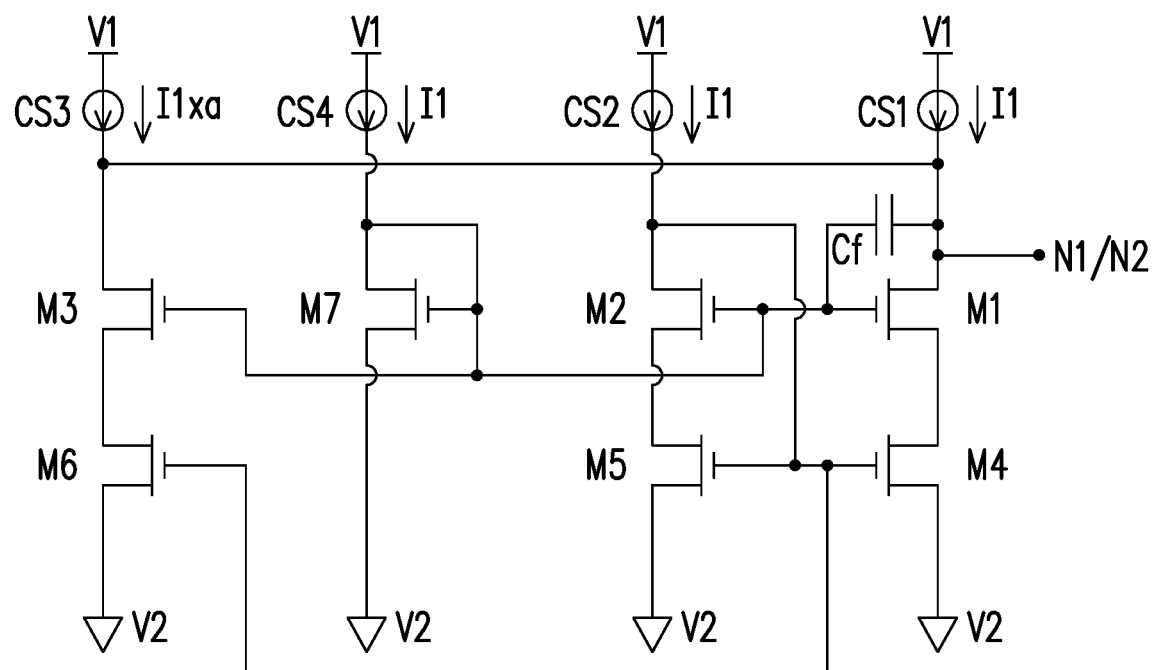

FIG. 9A to FIG. 9C are detailed circuit diagrams illustrating the capacitor circuits C1 and C2 in different embodiments.

FIG. 9A is a detailed circuit diagram illustrating the capacitor circuits C1 and C2 according to an embodiment of the disclosure. Referring to FIG. 9A, in an embodiment of the disclosure, a capacitor circuit 1000 includes the first terminal N1/N2, a transistor M1, a transistor M2, a transistor M3 and a capacitor Cf. A first terminal of the transistor M1 is configured to be coupled to a current source CS1 and the first terminal N1/N2 of the capacitor circuit, and a second terminal of the transistor M1 is coupled to the reference voltage terminal V2. A first terminal of the transistor M2 is configured to be coupled to a current source CS2, a second terminal of the transistor M2 is coupled to the reference voltage terminal V2, and a control terminal of the transistor M2 is coupled to the first terminal of the transistor M2 and a control terminal of the transistor M1. A first terminal of the transistor M3 is configured to be coupled to a current source CS3 and the first terminal of the transistor M1, a second terminal of the transistor M3 is coupled to the reference voltage terminal V2, and a control terminal of the transistor M3 is coupled to the control terminal of the transistor M2. A first terminal of the capacitor Cf is coupled to the first terminal N1/N2 of the capacitor circuit, and a second terminal of the capacitor Cf is coupled to the control terminal of the transistor M1. In the disclosure, the second terminals of the transistors M1 to M3 serve as the second terminals of the capacitor circuits.

In the present embodiment, the current sources CS1 and CS2 generate currents having a current value of I1 (which is represented by I1 in the drawing), and the current source CS3 generates a current having a current value of I1 multiplied by a multiple of a (which is represented by I1×a in the drawing). A small signal current flowing through the transistor M1 and flowing through the capacitor Cf is a current having a current value of Ic, and a small signal current flowing through the transistor M3 is a current having a current value of Ic×a. The transistors M1 and M2 have the same channel width-to-length ratio, and the channel width-to-length ratio of the transistor M3 is a value obtained by multiplying the channel width-to-length ratio of the transistor M1 by the multiple a. Based on the conditions set forth above, an equivalent capacitance of the capacitor circuit 1000 is approximately equal to (2+a)×C, wherein C is a capacitance of the capacitor Cf.

FIG. 9B is a detailed circuit diagram illustrating the capacitor circuits C1 and C2 according to another embodiment of the disclosure. A capacitor circuit 1010 illustrated in FIG. 9B is formed by three cascaded circuits.

Referring to FIG. 9B, in an embodiment of the disclosure, the capacitor circuit 1010 illustrated in FIG. 9B is different from the capacitor circuit 1000 illustrated in FIG. 9A in that the capacitor circuit 1010 further includes a transistor M4, a transistor M5 and a transistor M6. A first terminal and a second terminal of the transistor M4 are respectively coupled between the second terminal of the transistor M1 and the reference voltage terminal V2. A first terminal and a second terminal of the transistor M5 are respectively coupled between the second terminal of the transistor M2 and the reference voltage terminal V2, and a control terminal of the transistor M5 is coupled to the first terminal of the transistor M5 and a control terminal of the transistor M4. A first terminal and a second terminal of the transistor M6 are respectively coupled between the second terminal of the transistor M3 and the reference voltage terminal V2, and a control terminal of the transistor M6 is coupled to the control terminal of the transistor M5. In the disclosure, the second terminals of the transistors M4 to M6 are served as the second terminals of the capacitor circuits.

In the present embodiment, the current sources CS1 and CS2 generate the currents having the current value of I1 (which is represented by I1 in the drawing), and the current source CS3 generates the current having the current value of I1 multiplied by the multiple of a (which is represented by I1×a in the drawing). The small signal current flowing through the transistor M1 and flowing through the capacitor Cf is the current having the current value of Ic, and the small signal current flowing through the transistor M3 is the current having the current value of Ic×a. The transistors M1, M2, M4 and M5 have the same channel width-to-length ratio, the transistors M3 and M6 have the same channel width-to-length ratio, and the channel width-to-length ratio of the transistor M3 is a value obtained by multiplying the channel width-to-length ratio of the transistor M1 by the multiple a. Based on the conditions set forth above, an equivalent capacitance of the capacitor circuit 1010 is approximately equal to (2+a)×C, wherein C is the capacitance of the capacitor Cf.

FIG. 9C is a detailed circuit diagram illustrating the capacitor circuits C1 and C2 according to another embodiment of the disclosure. Referring to FIG. 9C, in an embodiment of the disclosure, a capacitor circuit 1020 includes the first terminal N1/N2, the transistors M1 to M7 and the capacitor Cf. The first terminal of the transistor M1 is configured to be coupled to the current source CS1 and the first terminal N1/N2 of the capacitor circuit. The first terminal of the transistor M2 is configured to be coupled to the current source CS2, and the control terminal of the transistor M2 is coupled to the control terminal of the transistor M1. The first terminal of the transistor M3 is configured to be coupled to the current source CS3 and the first terminal of the transistor M1, and the control terminal of the transistor M3 is coupled to the control terminal of the transistor M2. The first terminal of the transistor M4 is coupled to the second terminal of the transistor M1, the second terminal of the transistor M4 is coupled to the reference voltage terminal V2. The first terminal of the transistor M5 is coupled to the second terminal of the transistor M2, the second terminal of the transistor M5 is coupled to the reference voltage terminal V2, and the control terminal of the transistor M5 is coupled to the first terminal of the transistor M2 and the control terminal of the transistor M4. The first terminal of the transistor M6 is coupled to the second terminal of the transistor M3, the second terminal of the transistor M6 is coupled to the reference voltage terminal V2, and the control terminal of the transistor M6 is coupled to the control terminal of the transistor M5. A first terminal of the transistor M7 is configured to be coupled to a current source CS4, a second terminal of the transistor M7 is coupled to the reference voltage terminal V2, and a control terminal of the transistor M7 is coupled to the first terminal of the transistor M7 and the control terminal of the transistor M3. The first terminal of the capacitor Cf is coupled to the first terminal N1/N2 of the capacitor circuit, and the second terminal of the capacitor Cf is coupled to the control terminal of the transistor M1. In the disclosure, the second terminals of the transistors M4 to M7 serve as the second terminals of the capacitor circuits.

In the present embodiment, the current sources CS1, CS2 and CS4 generate currents having the current value of I1 (which is represented by I1 in the drawing), and the current source CS3 generates the current having the current value of I1 multiplied by the multiple of a (which is represented by I1×a in the drawing). A small signal current flowing through the transistor M1 is a current having a current value of Ic×n, a small signal current flowing through the capacitor Cf and flowing through the transistor M7 is a current having the current value of Ic, and a small signal current flowing through the transistor M3 is a current having the current value Ic×n×a. The transistors M1, M2, M4 and M5 have the same channel width-to-length ratio, the transistors M3 and M6 have the same channel width-to-length ratio, the channel width-to-length ratio of the transistor M3 is a value obtained by multiplying the channel width-to-length ratio of the transistor M1 by the multiple a, and the channel width-to-length ratio of the transistor M7 is a value obtained by multiplying the channel-width to length ratio of the transistor M1 by a multiple k. Based on the conditions set forth above, an equivalent capacitance of the capacitor circuit 1020 is approximately equal to $(1+n+a \times n) \times C$, wherein C is the capacitance of the capacitor Cf, n is a function value of the multiple of k. In some embodiments, n is approximately equal to 1, and k is approximately equal to 0.25, which is not particularly limited in the disclosure.

It is worth noting that the equivalent capacitance provided by the capacitor circuit 1000, 1010 or 1020 constituted by the specifically designed circuit structure is related to the multiple of a, and thus, the capacitor circuit may provide a greater equivalent capacitance and have a smaller area in comparison with a single capacitor having the same capacitance, so as to reduce for the design area of the mixer module, the capacitor circuit and the capacitance multiplier filter. The capacitance multiplier filter using the capacitor circuit 1000, 1010 or 1020 may have a greater time constant in comparison with the capacitance multiplier filter in which a single capacitor is coupled between the first receiving terminal of the buffer and the reference voltage terminal (for example, the reference voltage terminal V2 illustrated in FIG. 8A) or in which a single capacitor is coupled between the first receiving terminal and the second receiving terminal of the buffer. Additionally, the capacitance multiplier filter using the capacitor circuit 1000, 1010 or 1020 may be applied at a low frequency and configured to filter out IF signals. Those who apply the present embodiment may also apply the capacitor circuit 1000, 1010 or 1020 to other electronic apparatuses or signal filtering apparatuses in different technical fields, and the application fields of the capacitor circuit 1000, 1010 or 1020 are not limited in the disclosure.

In some embodiments, the aforementioned current sources CS1 to CS4 may be disposed inside or outside each of the capacitor circuits 1000 to 1020, the first terminal of each of the current sources CS1 to CS4 is coupled to the reference voltage terminal V1, the second terminal of each of the current sources CS1 to CS4 is coupled to the corresponding transistors M1 to M3 and M7. In some embodiments, when being applied in the single-ended circuit, the reference voltage terminal V2 in each of the capacitor circuits C1, C2 and 1000 to 1020 is, for example, configured to receive the common mode voltage, and when being applied in the double-ended circuit, the reference voltage terminal V2 is, for example, configured to receive the ground voltage, which is not particularly limited in the disclosure. In some embodiments, the reference voltage terminal V1 is, for example, configured to receive the supply voltage, which is not particularly limited in the disclosure. In some embodiments, the transistors M1 to M7 are, for example, P-type metal oxide semiconductor (PMOS) transistors, N-type metal oxide semiconductor (NMOS) transistors or bipolar junction transistors (BJTs), which are not particularly limited in the disclosure. In some embodiments, when the transistors M1 to M7 are PMOS transistors, the first terminals of the transistors M1 to M7 are the sources, the second terminals are the drains, and the control terminals are the gates. When the transistors M1 to M7 are NMOS transistors, the first terminals of the transistors M1 to M7 are drains, the second terminals are sources, and the control terminals are gates. When the transistors M1 to M7 are NPN-type BJTs, the first terminals of the transistors M1 to M7 are collectors, the second terminals are emitters, and the control terminals are bases. When the transistors M1 to M7 are PNP-type BJTs, the first terminals of the transistors M1 to M7 are emitters, the second terminals are collectors, and the control terminals are bases.

Figure 10:
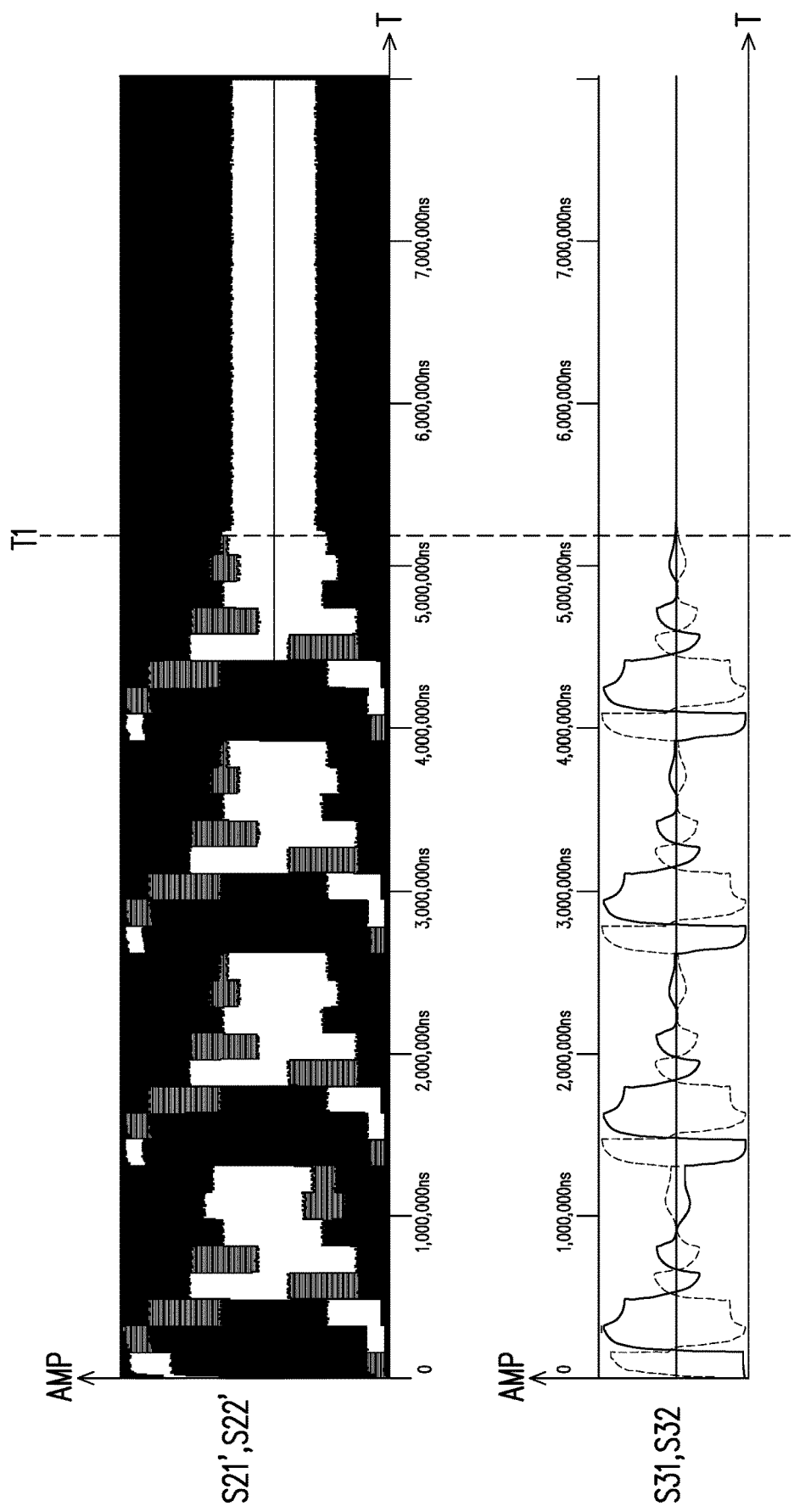
FIG. 10 is a waveform diagram illustrating a signal processed by the mixer module according to an embodiment of the disclosure.

FIG. 10 is a waveform diagram illustrating a signal processed by the mixer module according to an embodiment of the disclosure. It should be specially noted that to facilitate observation of the DC portion of the signal S1, the amplified signals S21' and S22' and the signals S31 and S32 are illustrated for description.

Referring to FIG. 6 and FIG. 10 simultaneously, FIG. 10 shows the waveform diagram of the amplified signals S21' and S22' and the signals S31 and S32 when the mixer module 600 of the embodiment of the disclosure is used. In FIG. 10, the horizontal axis represents the time T, and the vertical axis represents amplitudes AMP of the signals. As illustrated in FIG. 10, before a time T1, the control circuit 441 in the controller 140 performs coarse adjustment operations to the DC offset circuits 120 and 121, and at the time T1, the control circuit 642 in the controller 140 starts to perform the fine adjustment operations to the DC offset circuits 120 and 121, so as to reduce the DC portions of the amplified signals S21' and S22' and the signals S31 and S32. Those who apply the present embodiment may also adjust the time for performing the coarse adjustment operation and performing the fine adjustment operation based on demands.

Based on the above, in the mixer modules, the capacitor circuits and the capacitance multiplier filters provided by the embodiments of the disclosure, the DC portion of the mixed input signal is adjusted through the DC offset circuit, such that the DC portion of the adjusted mixed input signal is reduced. Thus, the mixer module can output the accurate signal, so as to enhance the performance of the overall system. On the other hand, in the embodiments of the disclosure, the capacitor circuit constituted by using the specifically designed circuit structure, in comparison with a single capacitor having the same capacitance, can provide greater equivalent capacitance and have a smaller area, so as to reduce the designed areas for the mixer module, the capacitor circuit and the capacitance multiplier filter. Moreover, the capacitance multiplier filter of the embodiments of the disclosure includes the aforementioned capacitor circuit, thus, can have a greater time constant and can be applied at low frequencies.

Although the disclosure has been described with reference to the above embodiments, it will be apparent to one of the ordinary skill in the art that modifications to the described embodiment may be made without departing from the spirit of the disclosure. Accordingly, the scope of the disclosure will be defined by the attached claims not by the above detailed descriptions.

What is claimed is:

1. A mixer module, comprising:
a mixer, mixing an input signal to generate a first signal;
at least one DC offset circuit, generating a second signal based on the first signal;
a filter, filtering out an AC portion of the second signal and generating a third signal according to a DC portion of the second signal; and
a controller, controlling the at least one DC offset circuit based on the third signal to reduce a DC portion of the first signal.

2. The mixer module according to claim 1, further comprising:
an analog-to-digital converter, receiving the second signal and converting the second signal into a digital output signal; and
a digital signal processor, receiving the digital output signal and generating a first correction value based on the digital output signal,
wherein the controller generates a first control signal based on the third signal or the first correction value to control the at least one DC offset circuit.

3. The mixer module according to claim 2, wherein the controller comprises:
a first control circuit, generating a second correction value based on the third signal; and
a multiplexer, having an output terminal coupled to a digital input terminal of the first control circuit, a first terminal receiving the second correction value, a second terminal receiving the first correction value, and a control terminal controlled by the digital signal processor,
wherein the digital signal processor controls the multiplexer to select one of the first correction value and the second correction value as an output to the first control circuit,
wherein the first control circuit generates the first control signal based on the output of the multiplexer.

4. The mixer module according to claim 1, further comprising:
at least one amplifier, coupled between the at least one DC offset circuit and the filter, and the at least one amplifier amplifying the second signal to output an amplified second signal.

5. The mixer module according to claim 4, further comprising:
an analog-to-digital converter, receiving the amplified second signal and converting the amplified second signal into a digital output signal; and
a digital signal processor, receiving the digital output signal and generating a first correction value based on the digital output signal,
wherein the controller generates a first control signal based on the third signal or the first correction value to control the at least one DC offset circuit.

6. The mixer module according to claim 5, wherein the controller comprises:
a first control circuit, generating a second correction value based on the third signal; and
a multiplexer, having an output terminal coupled to a digital input terminal of the first control circuit, a first terminal receiving the second correction value, a second terminal receiving the first correction value, and a control terminal controlled by the digital signal processor,
wherein the digital signal processor controls the multiplexer to select one of the first correction value and the second correction value as an output to the first control circuit,
wherein the first control circuit generates the first control signal based on the output of the multiplexer.

7. The mixer module according to claim 1, wherein the controller comprises:
a first control circuit, generating a first control signal based on the third signal, wherein the at least one DC offset circuit reduces the DC portion of the first signal based on the first control signal.

8. The mixer module according to claim 7, wherein the first control circuit comprises:
a comparator, comparing the third signal with a predetermined voltage to generate the first control signal.

9. The mixer module according to claim 7, wherein the third signal comprises a fourth signal and a fifth signal, and the fourth signal and the fifth signal are differential signals to each other, and the first control circuit comprises:
a comparator, comparing the fourth signal with the fifth signal to generate the first control signal,
wherein the first control signal comprises a pair of differential signals.

10. The mixer module according to claim 7, wherein the first control circuit comprises:
a comparator, comparing the third signal with a predetermined voltage to generate a comparison result;
a counter, receiving a clock signal to count a value;
a register, generating a second correction value according to the comparison result and the value; and
a digital-to-analog converter, converting the second correction value into the first control signal.

11. The mixer module according to claim 7, wherein the third signal comprises a fourth signal and a fifth signal, the fourth signal and the fifth signal are differential signals to each other, and the first control circuit comprises:
- a comparator, comparing the fourth signal and the fifth signal to generate a comparison result;
- a counter, receiving a clock signal to count a value;
- a register, generating a second correction value according to the comparison result and the value; and
- a digital-to-analog converter, converting the second correction value into the first control signal,
- wherein the first control signal comprises a pair of differential signals.

12. The mixer module according to claim 7, wherein the controller further comprises:
- a second control circuit, generating a second control signal based on the third signal, wherein the at least one DC offset circuit, further based on the second control signal, reduces the DC portion of the first signal,
- wherein the first control circuit is configured to perform a coarse adjustment operation to the at least one DC offset circuit, and the second control circuit is configured to perform a fine adjustment operation to the at least one DC offset circuit.

13. The mixer module according to claim 12, wherein the second control circuit comprises a transconductance amplifier.

14. The mixer module according to claim 1, wherein the mixer further receives a local oscillation signal to mix the input signal.

15. The mixer module according to claim 1, wherein the at least one DC offset circuit comprises:
- a first controllable current source, comprising a first terminal coupled to a first reference voltage terminal;
- a second controllable current source, comprising a second terminal coupled to a second reference voltage terminal; and
- a resistor, comprising a first terminal and a second terminal respectively coupled to a second terminal of the first controllable current source and a first terminal of the second controllable current source, and one of the first terminal and the second terminal of the resistor is further coupled to an output terminal of the mixer, the other one of the first terminal and the second terminal of the resistor are further coupled to the filter,
- wherein the first controllable current source and the second controllable current source are controlled by the controller.

16. The mixer module according to claim 15, wherein the at least one DC offset circuit further comprises:
- a third controllable current source, comprising a first terminal coupled to the first reference voltage terminal; and
- a fourth controllable current source, comprising a second terminal coupled to the second reference voltage terminal,
- wherein the first terminal and the second terminal of the resistor are further respectively coupled to a first terminal of the fourth controllable current source and a second terminal of the third controllable current source,
- wherein the third controllable current source and the fourth controllable current source are controlled by the controller.

17. The mixer module according to claim 1, wherein the at least one DC offset circuit comprises:
- a current source, comprising a first terminal and a second terminal, respectively coupled between a first reference voltage terminal and a second reference voltage terminal; and
- a resistor, comprising a first terminal and a second terminal, respectively coupled between the second terminal of the current source and the second reference voltage terminal, and one of the first terminal and the second terminal of the resistor is further coupled to an output terminal of the mixer, the other one of the first terminal and the second terminal of the resistor are further coupled to the filter,
- wherein the controller is configured to adjust a voltage drop between the first terminal and the second terminal of the resistor.

18. The mixer module according to claim 1, wherein each of the input signal, the first signal, the second signal, the third signal comprises a pair of differential signals.

19. The mixer module according to claim 1, wherein the filter comprises a low pass filter.

20. The mixer module according to claim 19, wherein the low pass filter comprises a capacitance multiplier filter.

* * * * *